United States Patent
Takami

(10) Patent No.: US 6,501,310 B2
(45) Date of Patent: Dec. 31, 2002

(54) SAMPLING CLOCK ADJUSTING METHOD, AND AN INTERFACE CIRCUIT FOR DISPLAYING DIGITAL IMAGE

(75) Inventor: Kazuhiko Takami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/805,926

(22) Filed: Mar. 15, 2001

(65) Prior Publication Data

US 2001/0022523 A1 Sep. 20, 2001

(30) Foreign Application Priority Data

Mar. 16, 2000 (JP) ........................................ 2000-074794

(51) Int. Cl.$^7$ ................................................ H03L 7/00

(52) U.S. Cl. ........................... 327/160; 327/151; 327/48

(58) Field of Search ................................ 327/151, 156, 327/160, 147, 141, 114, 48, 45, 9

(56) References Cited

U.S. PATENT DOCUMENTS 5,808,691 A * 9/1998 Malcolm, Jr. et al. ...... 348/537

* cited by examiner

Primary Examiner—Kenneth B. Wells
Assistant Examiner—Cassandra Cox
(74) Attorney, Agent, or Firm—McGinn & Gibb, PLLC

(57) ABSTRACT

The PLL (Phase Lock Loop) circuit generates a sampling clock for sampling an analog image signal and a second clock having a frequency equal to that of the sampling clock and a phase different from that of the sampling clock based on the horizontal synchronizing signal supplied together with the analog image signal. The measuring circuit counts the number of pulses of the sampling clock and the number of pulses of the second clock for a predetermined time period. The MPU (Micro Processing Unit) determines whether or not the numbers of pulses of the sampling clock and second clock have been counted correctly based on the number of pulses of the sampling clock and the number of pulses of the second clock. Then, the MPU adjusts the frequency and phase of the sampling clock, when it is determined that the numbers have been counted correctly.

16 Claims, 14 Drawing Sheets

SAMPLING CLOCK ADJUSTING METHOD, AND AN INTERFACE CIRCUIT FOR DISPLAYING DIGITAL IMAGE

BACKGROUND OF THE INVENTION

1. Field of the Invention

The present invention relates to a sampling clock adjusting method for generating a digital image signal using an analog image signal. The present invention also relates to an interface circuit for adjusting a sampling clock.

2. Description of the Related Art

Recently, digital display devices, such as a liquid crystal display and the like have been commonly used. For example, liquid crystal displays have become widely used instead of CRT (Cathode Ray Tube) displays and the like, as the display of computers.

In the case where a digital display device is used instead of an analog display device, an analog image signal should be converted to a digital image signal by sampling the analog image signal at predetermined intervals.

Since a device for generating an image signal generates an analog image signal by using an internal video clock, the level of the image signal changes according to the cycle of this video clock. Due to this, at the time of sampling an analog image signal, the sampling needs to be conducted according to a cycle which is the same as the cycle of the video clock. Further, if the sampling is conducted in an area where the level of the image signal is unstable, a noise might occur in the image to be displayed. Due to this, the sampling of the image signal needs to be conducted in an area where the level of the image signal is stable.

FIG. 10 is a block diagram showing one example of the interface circuit for generating a signal for sampling (sampling clock).

The interface circuit receives an analog image signal 101, a horizontal synchronizing signal 105 and a vertical synchronizing signal 109 supplied from an image signal output device (not shown), such as a computer etc., then, the interface circuit outputs the image signal 101, a regenerative horizontal synchronizing signal 106 and a sampling clock 108 to a digital display device 9.

As shown in FIG. 10, the interface circuit comprises a PLL (Phase Lock Loop) circuit 4, an MPU (Micro Processing Unit) 5 and a delay circuit 6.

As shown in FIG. 11, the PLL circuit 4 comprises a phase detector 21, a LPF (Low Pass Filter) 22, a VCO (Voltage Controlled Oscillator) 23 and a frequency divider 24.

The PLL circuit 4 generates the regenerative horizontal synchronizing signal 106 having a frequency F equal to that of the horizontal synchronizing signal 105 and a base clock 107 having a frequency N·F which is N times as large as that of the horizontal synchronizing signal 105, from the horizontal synchronizing signal 105.

The regenerative horizontal synchronizing signal 106 is supplied from the PLL circuit 4 directly to the display device 9. The base clock 107 is supplied to the display device 9 as the sampling clock 108 after the phase thereof is delayed by the delay circuit 6.

The display device 9 samples the image signal 101 by using the regenerative horizontal synchronizing signal 106 and the sampling clock 108 which are supplied from the interface circuit, and converts the analog image signal into a digital image signal Then, the display device 9 displays a predetermined image with the digital image signal.

In the case where the image is not displayed desirably as a result of the interference of a noise and the like, the frequency and phase of the sampling clock 108 are adjusted by adjusting the dividing value of the frequency divider 24, and the delay amount of the delay circuit 6. Specifically, the frequency of the sampling clock 108 is set equal to the frequency of the video clock in the device for generating the image signal 101, and the phase of the sampling clock 108 is adjusted so that the image signal 101 can be sampled in an area where the level of the image signal 101 is stable.

In the case where the interface circuit having the structure shown in FIG. 10 is used, the dividing value of the frequency divider 24 and the delay amount of the delay circuit 6 are manually adjusted. Specifically, a operator of the display device 9 operates predetermined buttons and dials while watching the image displayed on the display device 9. Due to this, signals indicating the dividing value and the delay amount, respectively, are input in the MPU 5. The MPU 5 adjusts the frequency and phase of the sampling clock 108 by setting the dividing value of the frequency divider 24 and the delay amount of the delay circuit 6 in accordance with the input signals.

However, manual adjustment of the dividing value and the delay amount is troublesome and requires a high level of skill and experience. Therefore, an interface circuit which automatically adjusts the dividing value and the delay amount has been proposed.

FIG. 12 is a block diagram showing one example of an interface circuit which automatically adjusts the frequency and phase of the sampling clock 108.

As shown in FIG. 12, the interface circuit which automatically adjusts the sampling clock 108 comprises a clamping circuit 1, a D/A converter 2, a comparator 3, and a measuring circuit 8 in addition to the structure of the interface circuit shown in FIG. 10.

The analog image signal 101 supplied from the image signal output device is generally a signal having an amplitude of 0.7 volt and does not contain any direct-current component. The clamping circuit 1 clamps the image signal 101 at a reference potential by adding a predetermined direct current voltage to the image signal 101, and outputs the image signal 101 as an image signal 102 to the comparator 3.

The comparator 3 determines whether or not there are predetermined data, based on the level of the image signal 102. Specifically, the comparator 3 determines whether or not there are predetermined data in accordance with whether the level of the image signal 102 is higher or lower than the level of the reference voltage 103 supplied from the MPU 5 via the D/A converter 2. Then, the comparator 3 outputs the data existence signal 104 representing the determination result into the measuring circuit 8.

As described above, the PLL circuit 4 generates the regenerative horizontal synchronizing signal 106 and the base clock 107 from the horizontal synchronizing signal 105. The regenerative horizontal synchronizing signal 106 is supplied from the PLL circuit 4 directly to the measuring circuit 8 and the display device 9. The base clock 107 is supplied from the PLL circuit 4 to the measuring circuit 8 and the display device 9 as the sampling clock 108 after the phase thereof is delayed by the delay circuit 6.

The measuring circuit 8 counts numbers of pulses of the sampling clock 108 supplied from the delay circuit 6, using the data existence signal 104 supplied from the comparator 3 and the regenerative horizontal synchronizing signal 106 supplied from the PLL circuit 4.

Specifically, as shown in FIG. 13, the measuring circuit 2 counts a number $HD_{min}$ of pulses of the sampling clock 108 and a number $HD_{max}$ of pulses of the sampling clock 108 during every one horizontal synchronization period (scanning period) which is a period since one fall until the next fall of the regenerative horizontal synchronizing signal 106.

The number $HD_{min}$ is a number of pulses which are counted since the first fall of the regenerative horizontal synchronizing signal 106 until the first rise of the data existence signal 104 during the scanning period. The number $HD_{max}$ is a number of pulses which are counted since the first fall of the regenerative horizontal synchronizing signal 106 and the final fall of the data existence signal 104.

Then, the measuring circuit 8 outputs measurement result signal 111 indicating the respective numbers $HD_{min}$ and $HD_{max}$, one after another into the MPU 5.

The MPU 5 previously stores a program for adjusting the frequency and phase of the sampling clock 108, information regarding resolutions of analog image signals, and the like.

First, the MPU 5 adjusts the frequency of the sampling clock 108, using the measurement result signals 111 supplied one after another from the measuring circuit 8.

Specifically, the MPU 5 obtains the numbers of pulses $HD_{min}$ and $HD_{max}$ from the measurement result signals 111 and stores the obtained numbers of pulses. However, the MPU 5 stores the minimum number among the numbers $HD_{min}$ and the maximum number among the numbers $HD_{max}$ all of which were obtained during one vertical synchronization period (field period) since one rise until the next rise of the vertical synchronizing signal 109.

The difference between the minimum number $HD_{min}$ and the maximum number $HD_{max}$ during one vertical synchronization period corresponds to the number of pixels arranged on each horizontal line of an image shown by the analog image signal 101, i.e. horizontal resolution of the analog image signal 101. The horizontal resolution can be derived from the horizontal synchronizing signal 105 and vertical synchronizing signal 109. The MPU 5 derives the horizontal resolution from the horizontal synchronizing signal 105 and vertical synchronizing signal 109 and calculates the difference of the numbers ($HD_{max}-HD_{min}$) after one vertical synchronization period. The MPU 5 determines whether or not the calculated difference is equal to the derived horizontal resolution.

When determined that the difference of the numbers is equal to the horizontal resolution of the analog image signal 101, the MPU 5 determines that the frequency of the sampling clock 108 is an adequate value.

On the other hand, when determined that the difference of the numbers is not equal to the horizontal resolution of the analog image signal 101, the MPU 5 determines that the frequency of the sampling clock 108 is not the adequate value. The MPU 5 adds +1 or −1 to the dividing value of the frequency divider 24 which is included in the PLL circuit 4. In such a way, the MPU 5 sets the difference of the numbers ($HD_{max}-HD_{min}$) to a value equal to the horizontal resolution.

After adjusting the frequency of the sampling clock 108 as described above, the MPU 5 adjusts the phase of the sampling clock 108 so that the image signal 102 can be sampled in an area where the level of the image signal 102 is stable.

Specifically, as shown in FIG. 14, by changing the delay amount of the delay circuit 6, the MPU 5 controls a changing point of the sampling clock 108 and a changing point of the data existence signal 104 into a condition wherein both of the changing points coincide with each other (hereinafter, referred to as the "first condition"). After this, by further changing the delay amount of the delay circuit 6, the MPU 5 changes the phase of the sampling clock 108 by 360 degrees, that is, by one pulse (this condition is referred to as the "second condition").

In the case where the phase of the sampling clock 108 is set into the middle of the phase in the first condition and the phase in the second condition, the image signal 102 can be sampled in an area where the level of the image signal 102 is stable. Accordingly, with a delay amount TDa of the delay circuit 6 in the first condition and a delay amount TDb of the delay circuit 6 in the second condition, the MPU 5 calculates a delay amount ((TDa+TDb)/2) which provides the most adequate phase of the sampling clock 108, and sets the delay amount of the delay circuit 6 to the calculated delay amount.

As described above, the MPU 5 adjusts the frequency and phase of the sampling clock 108.

However, the interface circuit having the structure shown in FIG. 12 may not adjust the sampling clock 108 correctly.

For example, as shown in FIG. 13, in the case where the changing point of the sampling clock 108 coincides with the changing point of the data existence signal 104 or with the changing point of the regenerative horizontal synchronizing signal 106, the measuring circuit 8 can not obtain the number of pulses $HD_{min}$ or $HD_{max}$ correctly. In this case, the difference ($HD_{max}-HD_{min}$) of the numbers of pulses is incorrect. Therefore, the MPU 5 can not adjust the frequency of the sampling clock 108 correctly.

Since the numbers of pulses can not be counted correctly, at the time of changing the phase of the sampling clock 108 by one pulse as shown in FIG. 14, the MPU 5 can not determine whether or not the phase has been changed precisely by one pulse.

As described above, the interface circuit shown in FIG. 12 may not adjust the frequency and phase of the sampling clock 108 correctly. As a result, an image may not be displayed with good looks.

SUMMARY OF THE INVENTION

Accordingly, it is an object of this invention to provide a method for adjusting a sampling clock for displaying a beautiful image.

It is another object of this invention to provide an interface circuit for generating a sampling clock for displaying a beautiful image.

It is another object of this invention to provide a method for adjusting a sampling clock correctly.

It is another object of this invention to provide an interface circuit for adjusting a sampling clock correctly.

To achieve the above objects, the sampling clock adjusting method according to the first aspect of this invention comprises:

counting a number of pulses of a sampling clock for sampling an analog image signal and a number of pulses of an adjustment clock having a frequency equal to a frequency of the sampling clock and a phase different from a phase of the sampling clock, for a predetermined time period;

determining whether or not the number of pulses of the sampling clock has been counted correctly, by comparing the counted number of pulses of the sampling clock and the counted number of pulses of the adjustment clock; and adjusting the frequency and phase of the sampling clock, in a case where it is determined that the number of pulses of the sampling clock has been counted correctly.

According to this invention, a beautiful image can be displayed.

The determining whether or not the number of pulses of the sampling clock has been counted correctly may include determining whether or not the number of pulses of the sampling clock has been counted correctly by determining whether or not the number of pulses of the sampling clock coincides with the number of pulses of the adjustment clock within a range of an error.

The sampling clock adjusting method may further comprise controlling the number of pulses of the sampling clock to coincide with the number of pulses of the adjustment clock within the range of the error by changing the phase of the sampling clock or the phase of the adjustment clock, in a case where it is determined that the number of pulses of the sampling clock has not been counted correctly.

The counting may comprise counting the numbers of pulses of the sampling clock and adjustment clock, respectively, during a time period since a change in a level of a horizontal synchronizing signal supplied together with the analog image signal until a change in a level of a data existence signal indicating whether or not the analog image signal includes predetermined data.

The determining whether or not the number of pulses of the sampling clock has been counted correctly may include determining whether or not the number of pulses of the sampling clock has been counted correctly by determining whether or not a difference between the number of pulses of the sampling clock and the number of pulses of the adjustment clock is equal to or lower than 1 pulse.

The sampling clock adjusting method may further comprise:
generating a base clock by changing a frequency of the horizontal synchronizing signal; and
generating the sampling clock and the adjustment clock by delaying a phase of the base clock by different delay amounts, respectively.

The adjusting the frequency and phase of the sampling clock may include:
deriving a horizontal resolution of the analog image signal from a vertical synchronizing signal, supplied together with the analog image signal, and the horizontal synchronizing signal;
counting a number $HD_{min}$ of pulses of the sampling clock during a time period since a change in the horizontal synchronzing signal until a first change in the data existence signal, and a number $HD_{max}$ of pulses of the sampling clock during a time period since the change in the horizontal synchronizing signal until a final change in the data existence signal within a range of one scanning period;
determining whether or not a difference in the numbers $HD_{max}$ and $HD_{min}$ ($HD_{max}-HD_{min}$) corresponds to the horizontal resolution; and
adjusting the frequency of the sampling clock in a case where it is determined that the difference in the numbers of pulses $HD_{max}$ and $HD_{min}$ does not coincide with the horizontal resolution.

The generating the base clock may include changing the frequency of the horizontal synchronizing signal with using a phase lock loop circuit which includes a frequency divider.

The adjusting the frequency of the sampling clock may include adjusting the frequency of the sampling clock by cbarging a dividing value of the frequency divider.

The adjusting the frequency of the sampling clock may include deriving the changed dividing value from an equation (1).

$$\text{(the changed dividing value)}=\text{(the horizontal resolution)}/\text{(the difference between the numbers } HD_{max} \text{ and } HD_{min})\times\text{(the current dividing value)} \quad (1)$$

The interface circuit according to the second aspect of this invention comprises:
a first counter which counts a number of pulses of a sampling clock for sampling an analog image signal and a number of pulses of an adjustment clock having a frequency equal to a frequency of the sampling clock and a phase different from a phase of the sampling clock, for a predetermined time period;
a first determination unit which determines whether or not the number of pulses of the sampling clock has been counted correctly, by comparing the counted number of pulses of the sampling clock and the counted number of pulses of the adjustment clock; and
a sampling clock adjustment unit which adjusts the frequency and phase of the sampling clock in a case where said first determination unit determines that the number of pulses of the sampling clock has been counted correctly.

The first determination unit may determine whether or not the number of pulses of the sampling clock has been counted correctly by determining whether or not the number of pulses of the sampling clock coincides with the number of pulses of the adjustment clock within a range of an error.

The interface circuit may further comprise a phase changing unit which controls the number of pulses of the sampling clock to coincide with the number of pulses of the adjustment clock within the range of the error by changing the phase of the sampling clock or the phase of the adjustment clock, in a case where the first determination unit determines that the number of pulses of the sampling clock has not been counted correctly.

The first counter may count the numbers of pulses of the sampling clock and the adjustment clock, respectively, during a time period since a change in a level of a horizontal synchronizing signal supplied together with the analog image signal until a change in a level of a data existence signal indicating whether or not the analog image signal includes predetermined data.

The first determination unit may determine whether or not the number of pulses of the sampling clock has been counted correctly by determining whether or not a difference between the number of pulses of the sampling clock and the number of pulses of the adjustment clock is equal to or lower than 1 pulse.

The interface circuit may further comprise:
a base clock generating unit for generating a base clock by changing a frequency of the horizontal synchronizing signal; and
a phase delaying unit for generating the sampling clock and the adjustment clock by delaying a phase of the base clock by different delay amounts, respectively.

The sampling clock adjustment unit may include:
a resolution specifying unit which derives a horizontal resolution of the analog image signal from a vertical synchronizing signal, supplied together with the analog image signal, and the horizontal synchronizing signal;
a second counter which counts the number $HD_{min}$ of pulses of the sampling clock during a time period since a change in the horizontal synchronizing signal until a first change in the data existence signal, and the number $HD_{max}$ of pulses of the sampling clock during a time period from the change in the horizontal synchronizing signal until a final change in the data existence signal within a range of one scanning period;

a second determination unit which determines whether or not a difference in the numbers $HD_{max}$ and $HD_{min}$ ($HD_{max}-HD_{min}$) corresponds to the horizontal resolution; and a frequency adjustment unit which adjusts the frequency of the sampling clock in a case where the second determination unit determines that the difference in the numbers of pulses $HD_{max}$ and $HD_{min}$ does not coincide with the horizontal resolution.

The base clock generating unit may include a phase lock loop circuit which has a frequency divider.

The frequency adjustment unit may adjust the frequency of the sampling clock by changing a dividing value of the frequency divider.

The frequency adjustment unit may derive the changed dividing value from an equation (2).

(the changed dividing value)=(the horizontal resolution value)/(the difference between the numbers $HD_{max}$ and $HD_{min}$)×(the current dividing value) (2)

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

An interface circuit for a digital display device according to one embodiment of the present invention will now be explained below with reference to the drawings.

The interface circuit according to this embodiment of the present invention converts signals for displaying an analog image supplied from an image signal output device, such as a computer, into signals for displaying a digital image, and outputs the converted signals to an display device for displaying a digital image.

Figure 1:
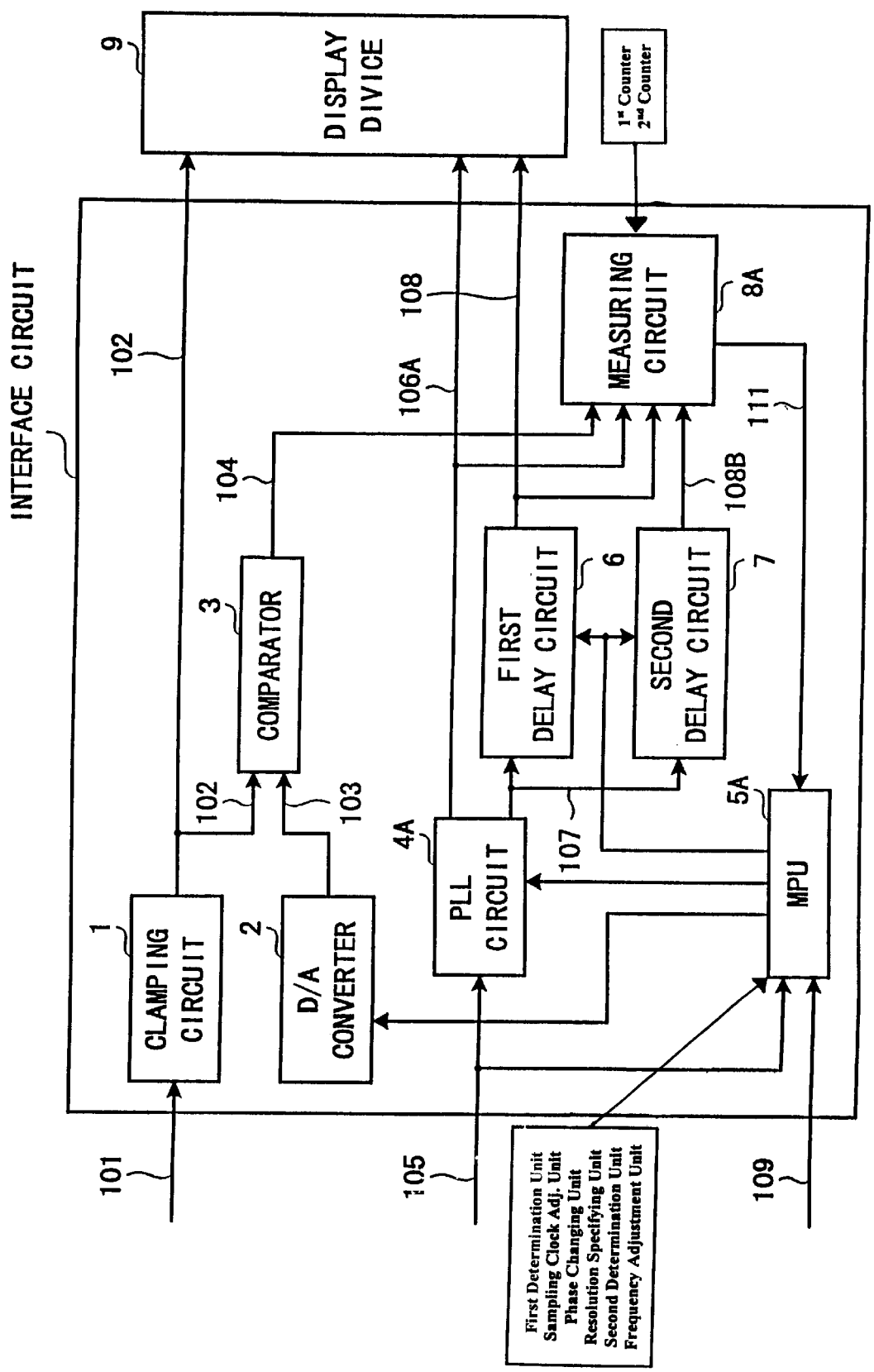
FIG. 1 is a block diagram showing interface circuit according to one embodiment of the present invention.

FIG. 1 is a block diagram showing the interface circuit according to this embodiment.

In FIG. 1, signals for displaying an analog image include an analog image signal 101, a horizontal synchronizing signal 105, and a vertical synchronizing signal 109. Signals for displaying a digital image include an analog image signal 102, a regenerative horizontal synchronizing signal 106A, and a sampling clock 108.

A display device 9 is, for example, a liquid crystal display, and comprises wellknown circuits necessary for displaying a digital image such as a sampling circuit, an A/D converter, a display driver circuit and the like. The display device 9 displays a predetermined digital image using the image signal 102, the regenerative horizontal synchronizing signal 106A, and the sampling clock 108 supplied from the interface circuit.

As shown in FIG. 1, the interface circuit comprises a clamping circuit 1, a D/A converter (digital/analog converter) 2, a comparator 3, a PLL (Phase Lock Loop) circuit 4A, an MPU (Micro Processing Unit) 5A, a first delay circuit 6, a second delay circuit 7, and a measuring circuit 8A.

The clamping circuit 1 generates the image signal 102 by adding a predetermined direct current voltage to the image signal 101 supplied from an external image signal output device (not shown), and outputs the image signal 102 into the comparator 3 and the display device 9.

The comparator 3 compares the level of the image signal 102 with the level of a reference voltage 103 which is supplied from the MPU 5A via the D/A converter 2. Then, the comparator 3 outputs a data existence signal 104 indicating the comparison result with a binary number, to the measuring circuit 8A.

Figure 2:
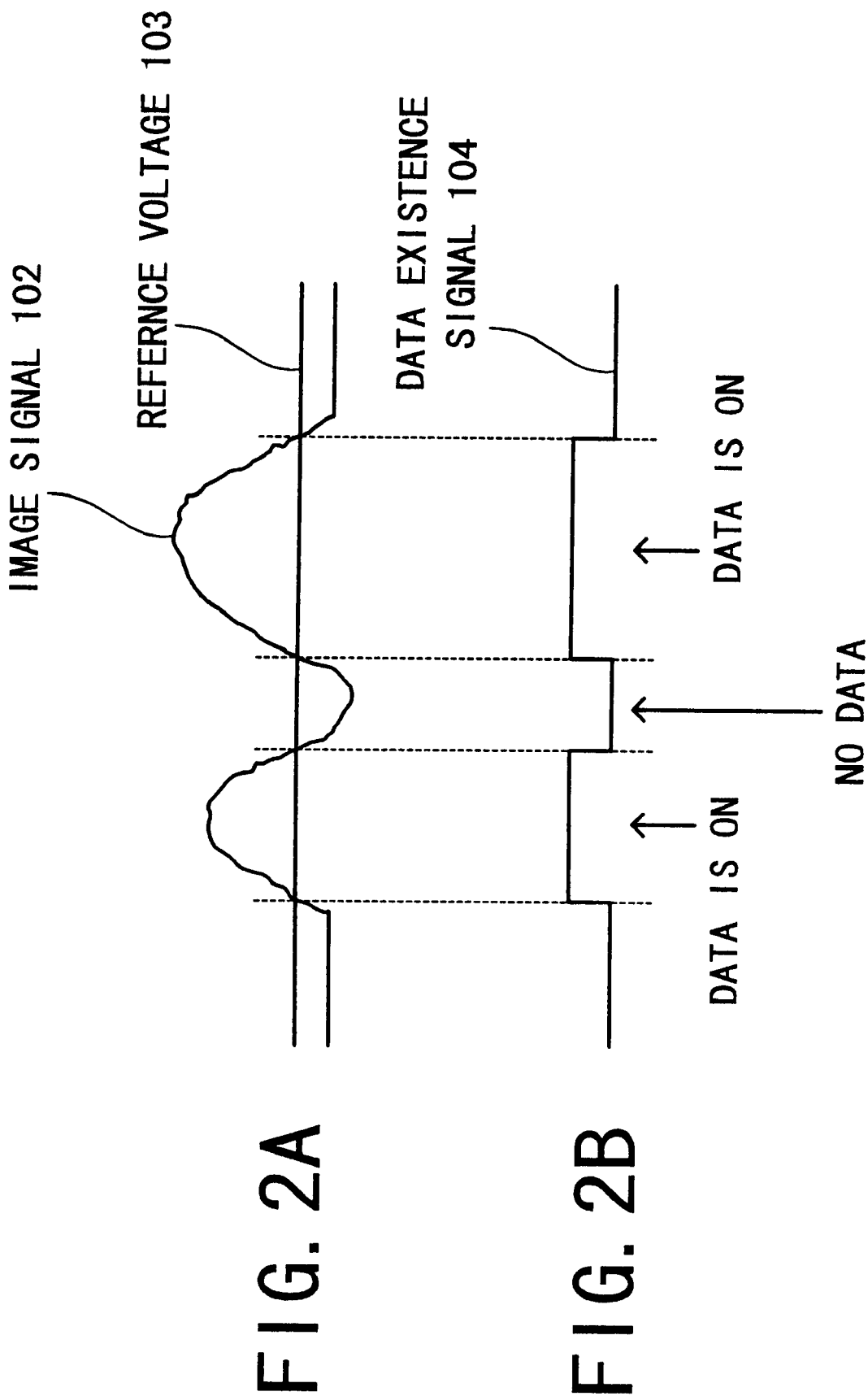
FIG. 2A is a waveform chart showing an image signal output from a clamping circuit which constitutes the interface circuit of FIG. 1.
FIG. 2B is a waveform chart showing a data existence signal output from a comparator which constitutes the interface circuit of FIG. 1.

Specifically, the comparator 3 determines whether the level of the image signal 102 is higher or lower than the level of the reference voltage 103. The comparator 3 determines there is some data, when determined that the level of the image signal 102 is higher than that of the reference voltage 103, and there is no data when determined that the level of the image signal 102 is lower than that of the reference voltage 103. Then, as shown in FIGS. 2A and 2B, the comparator 3 outputs, as the data existence signal 104, a signal of a high level (or "1") when determined that there is some data, or a signal of a low level (or "0") when determined that there is no data.

The PLL circuit 4A generates the regenerative horizontal synchronizing signal 106A and a base clock 107 using the horizontal synchronizing signal 105 supplied from the image signal output device in accordance with the control of the MPU 5A. Specifically, the PLL circuit 4A generates the regenerative horizontal synchronizing signal 106A having a frequency equal to a frequency of the horizontal synchronizing signal 105, and a phase synchronizing with a phase of the horizontal synchronizing signal 105. The PLL circuit 4A also generates the base clock 107 having a frequency N times as large as that of the horizontal synchronizing signal 105. Then, the PLL circuit 4A outputs the regenerative horizontal synchronizing signal 106A to the measuring circuit 8A and the display device 9, and outputs the base clock 107 to the first delay circuit 6 and the second delay circuit 7. The structure of the PLL circuit 4A will be detailed later.

The first delay circuit 6 delays the phase of the base clock 107 supplied from the PLL circuit 4A, and outputs this as the sampling clock (first clock) 108 to the measuring circuit 8A and the display device 9. The delay amount of the first delay circuit 6 is changeable and set by the MPU 5A.

The second delay circuit 7 delays the phase of the base clock 107 supplied from the PLL circuit 4A and outputs this as the second clock 108B to the measuring circuit 8A. The delay amount of the second delay circuit 7 is changeable and set by the MPU 5A. However, the delay amount of the second delay circuit 7 is different from that of the first delay circuit 6.

The measuring circuit 8A includes a counter and the like, and performes a predetermined measurement process with the data existence signal 104 supplied from the comparator 3, the regenerative horizontal synchronizing signal 106A supplied from the PLL circuit 4A, the sampling clock 108 supplied from the first delay circuit 6, and the second clock 108B supplied from the second delay circuit 7. Then, the measuring circuit 8A outputs the measurement result signal 111 indicating the measurement result into the MPU 5A. This measurement process will be specifically described later.

The MPU 5A includes a memory and the like, and stores in advance a program and data for adjusting the frequency and phase of the sampling clock 108 in the memory. The MPU 5A operates according to the program and data, and adjusts the frequency and phase of the sampling clock 108 with the horizontal synchronizing signal 105 and the vertical synchronizing signal 109, and the measurement result signal 111. Operations of the MPU 5A will be described later in more detail.

The structure of the PLL circuit 4A will now specifically be described.

Figure 3:
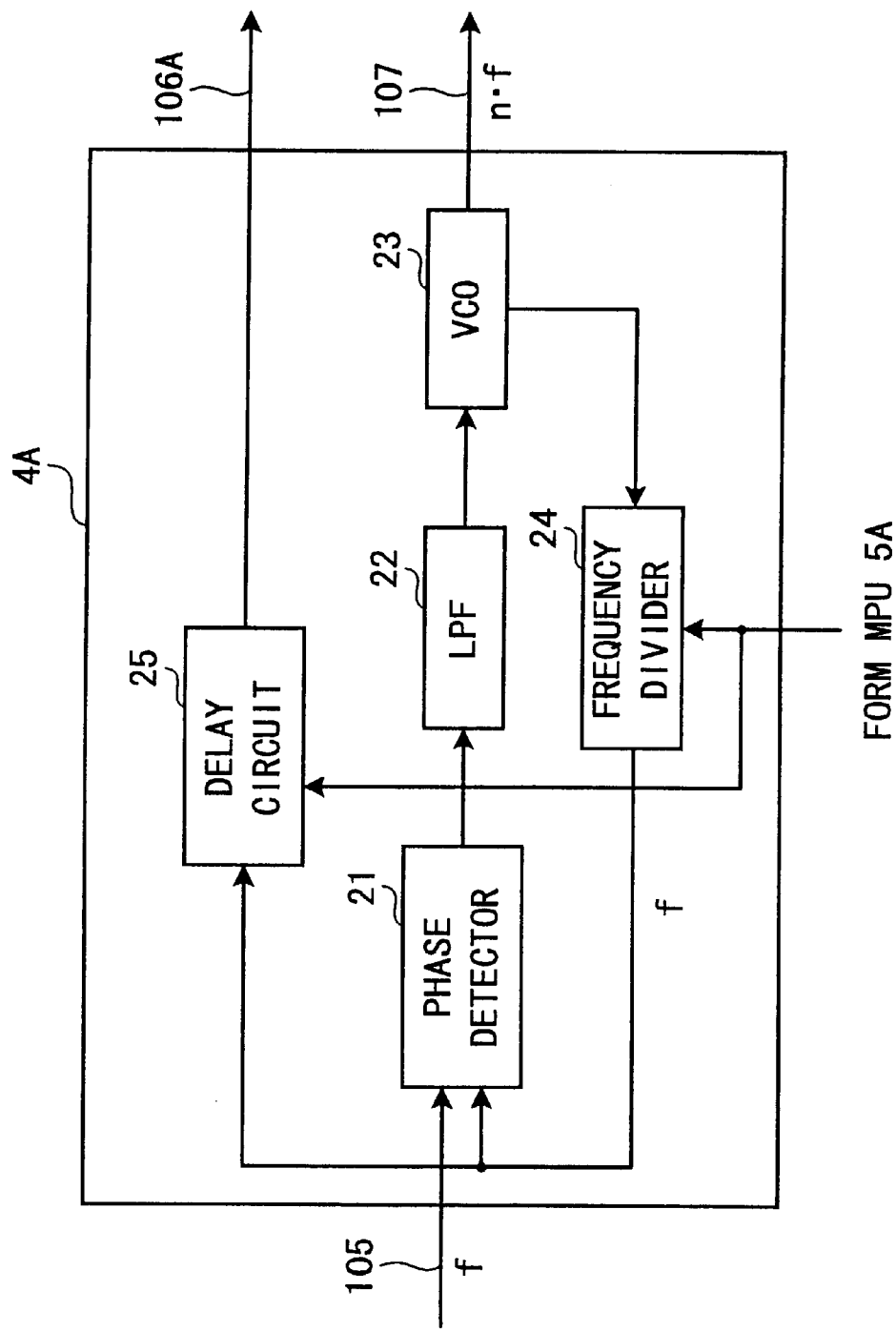
FIG. 3 is a block diagram showing a PLL (Phase Lock Loop) circuit which constitutes the interface circuit of FIG. 1.

As shown in FIG. 3, the PLL circuit 4A comprises a phase detector 21, an LPF (Low Pass Filter) 22, a VCO (Voltage Controlled Oscillator) 23, a frequency divider 24, and a delay circuit 25. As described so, the PLL circuit 4A is composed of a PLL frequency synthesizer (phase locked loop frequency synthesizer) comprising the phase detector 21, the LPF 22, the VCO 23, and the frequency divider 24, in addition to the delay circuit 25. In the structure where the delay circuit 25 is included in the PLL circuit 4A, the sampling clock 108 can securely be adjusted.

With the horizontal synchronizing signal 105 supplied from the image signal output device, the PLL frequency synthesizer generates a signal having a frequency N·F which is obtained by multiplying the frequency F of the horizontal synchronizing signal 105 by N. The signal having the frequency N·F is output, as the base clock 107, from the VCO 23 to the first delay circuit 6 and the second delay circuit 7.

The signal having the frequency N·F is output also to the delay circuit 25 after the frequency N·F is divided by N by the frequency divider 24. The dividing value N of the frequency divider 24 is changeable and set by the MPU 5A.

The delay circuit 25 delays the phase of the signal supplied from the frequency divider 24, and outputs this signal to the measuring circuit 8A and the display device 9, as the regenerative horizontal synchronizing signal 106A. The delay amount of the delay circuit 25 is changeable and set by the MPU 5A so as to synchronize the phase of the regenerative horizontal synchronizing signal 106A with the phase of the horizontal synchronizing signal 105.

The signal supplied from the frequency divider 24 is adjusted by the loop composed of the phase detector 21, the LPF 22, the VCO 23, and the frequency divider 24, so that the frequency of the adjusted signal may be equal to that of the horizontal synchronizing signal 105. Due to this, the regenerative horizontal synchronizing signal 106A has a frequency equal to the frequency of, and a phase synchronizing with the phase of the horizontal synchronizing signal 105.

Next, the operations of the interface circuit having the structure described above will now be described.

The comparator 3 compares the level of the image signal 102, supplied from the image signal output device via the clamping circuit 1, with the level of the reference voltage 103, supplied from the MPU 5A via the D/A converter 2. Then, the comparator 3 outputs the data existence signal 104 indicating the comparison result, to the measuring circuit 8A.

The MPU 5A calculates the resolution of the analog image signal 101 using the horizontal synchronizing signal 105 and the vertical synchronizing signal 109 supplied from the image signal output device.

The resolutions of analog image signals are set by standards organizations such as the VESA (Video Electronics Standards Association), etc. For example, the horizontal resolution×vertical resolution are set to be measured based on the multiplications of 640×480, 800×600, 1024×768, 1280×1024. The resolution can be calculated using, for example, a theoretical calculation technique with the frequencies of the respective horizontal synchronizing signal 105 and vertical synchronizing signal 109.

The MPU 5A stores, in advance, resolution information representing the frequencies of the horizontal synchronizing signal 105 and vertical synchronizing signal 109 in association with the resolution (horizontal resolution×vertical resolution). The MPU 5A measures the frequencies of the supplied horizontal synchronizing signal 105 and vertical synchronizing signal 109, and selects a corresponding resolution from the resolution information.

After this, according to a pre-stored program, the MPU 5A obtains a dividing value N of the frequency divider 24 from the selected resolution, and sets the obtained dividing value into the frequency divider 24.

Then, the regenerative horizontal synchronizing signal 106A having a frequency F equal to that of the horizontal synchronizing signal 105 and the base clock 107 having a frequency N·F which is N times as large as that of the horizontal synchronizing signal 105 are generated by the PLL circuit 4A.

The regenerative horizontal synchronizing signal 106A is supplied from the PLL circuit 4A directly to the measuring circuit 8A. The base clock 107 is supplied to the measuring circuit 8A as the sampling clock 108 and the second clock 108B via the first delay circuit 6 and the second delay circuit 7. The frequency of the sampling clock 108 is equal to that of the second clock 108B, whereas the phase of the sampling clock differs from that of the second clock 108B.

The measuring circuit 8A performs a measurement process, as will be described below, using the data existence signal 104 supplied from the comparator 3, the regenerative horizontal synchronizing signal 106A supplied from the PLL circuit 4A, the sampling clock 108 supplied from the first delay circuit 6, and the second clock 108B supplied from the second delay circuit 7.

The measuring circuit 8A counts the number of pulses of the sampling clock (first clock) 108 and the number of pulses of the second clock 108B generated during every one horizontal synchronization period (scanning period) which is a period from one fall of the regenerative horizontal synchronizing signal 106A until the next fall thereof.

Figure 4:
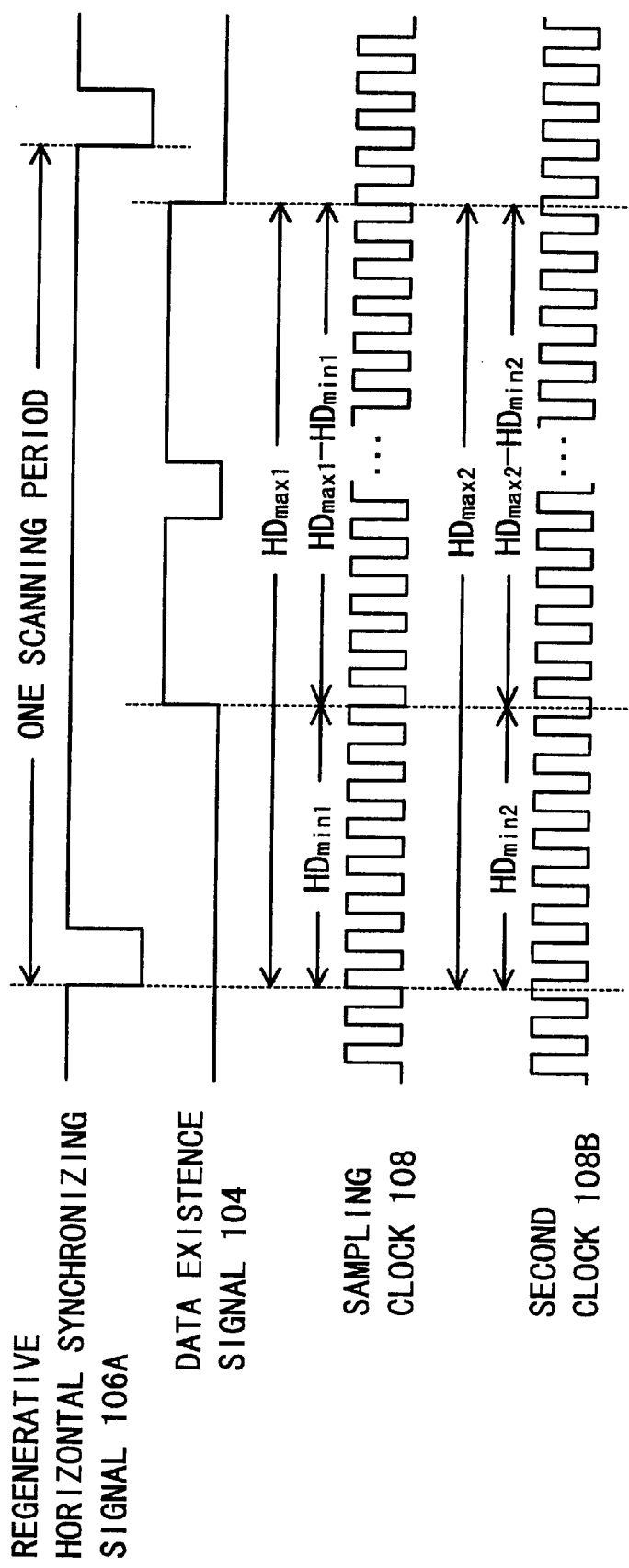
FIG. 4 is a diagram showing pulses counted by a measuring circuit which constitutes the interface circuit of FIG. 1.

Specifically, as shown in FIG. 4, the measuring circuit 8A counts numbers $HD_{min1}$ and $HD_{max2}$ of pulses generated during a period from the fall of the regenerative horizontal synchronizing signal 106A until the first rise of the data existence signal 104. In addition, the measuring circuit 8A counts numbers $HD_{max1}$ and $HD_{max2}$ of pulses generated during a period from the fall of the regenerative horizontal synchronizing signal 106A until the final fall of the data existence signal 104. The subscript 1 represents the number of pulses of the sampling clock (first clock) 108. The subscript 2 represents the number of pulses of the second clock 108B.

Then, the measuring circuit 8A sequentially outputs the measurement result signals 111 representing the numbers $HD_{min1}$, $HD_{min2}$, $HD_{max1}$, and $HD_{max2}$ to the MPU 5A.

The MPU 5A obtains the numbers $HD_{min1}$, $HD_{min2}$, $HD_{max1}$, and $HD_{max2}$ from the measurement result signals 111, and stores the numbers in the memory. The MPU 5A stores the minimum number as for the $HD_{min1}$, and $HD_{min2}$, and the maximum number among the numbers $HD_{max1}$ and among the numbers $HD_{max2}$ all of which are counted during one vertical synchronization period (field period) from one rise until the next rise of the vertical synchronizing signal 109.

Specifically, the MPU 5A compares, one after another, the numbers of pulses with each other, which are supplied from the measuring circuit 8A.

The MPU 5A updates the numbers of pulses which are stored in the memory, so that the smaller number between the numbers $HD_{min1}$ and $HD_{min2}$ is stored and that the larger number between the numbers $HD_{max1}$ and $HD_{max2}$. After this, the MPU 5A stores the minimum numbers of the numbers $HD_{min1}$ and $HD_{min2}$, respectively, and the maximum numbers of the numbers $HD_{max1}$ and $HD_{max2}$, respectively, which are counted during one vertical synchronization period in the memory. A difference between the minimum number $HD_{min1}$ and the maximum number $HD_{max1}$ and a difference between the minimum number $HD_{min2}$ and the maximum number $HD_{max2}$ correspond to the number of pixels arranged on each horizontal line of an image shown by the analog image signal 101, i.e., the horizontal resolution of the analog image signal 101.

After one vertical synchronization period, the MPU 5A adjusts the frequency of the sampling clock 108 with using the numbers $HD_{min1}$, $HD_{min2}$, $HD_{max1}$, and $HD_{max2}$ which are stored in the memory.

Figure 5A:
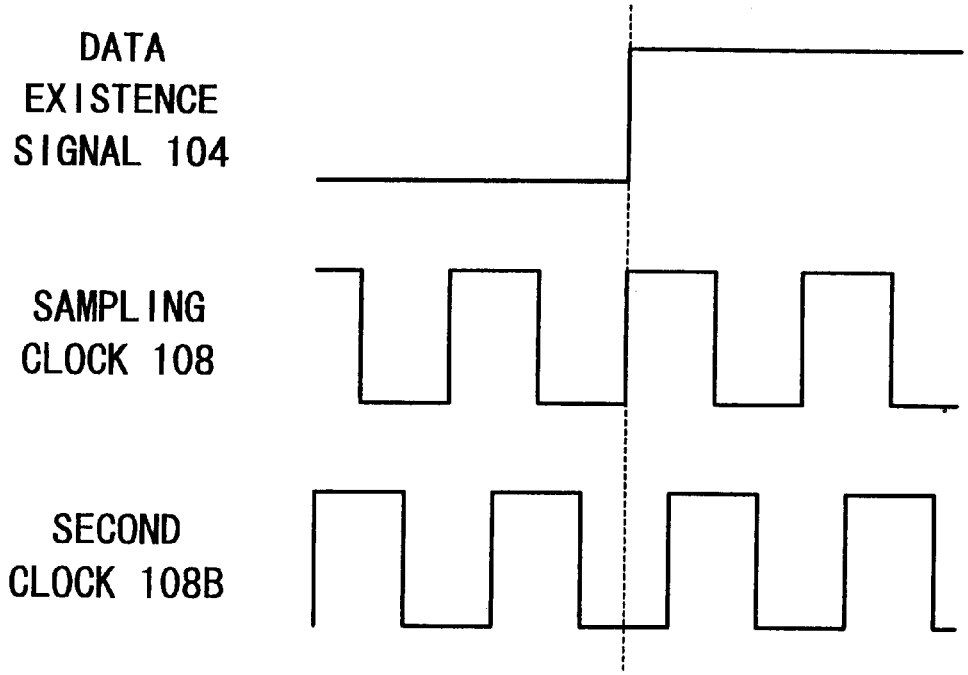
FIG. 5A is a diagram showing a condition where a rise of the data existence signal coincides with a rise of a sampling clock.

However, at the time of counting the number of pulses, if the changing point of the first clock 108 or the second clock 108B overlaps with the changing point of the data existence signal 104, the numbers of pulses can not be counted correctly. For example, as shown in FIG. 5A, in the case where the changing point of the first clock 108 overlaps with that of the data existence signal 104, the number $HD_{min1}$ of pulses is not counted correctly. In this case, the number $HD_{min1}$ of pulses is different from the number $HD_{min2}$.

Figure 6:
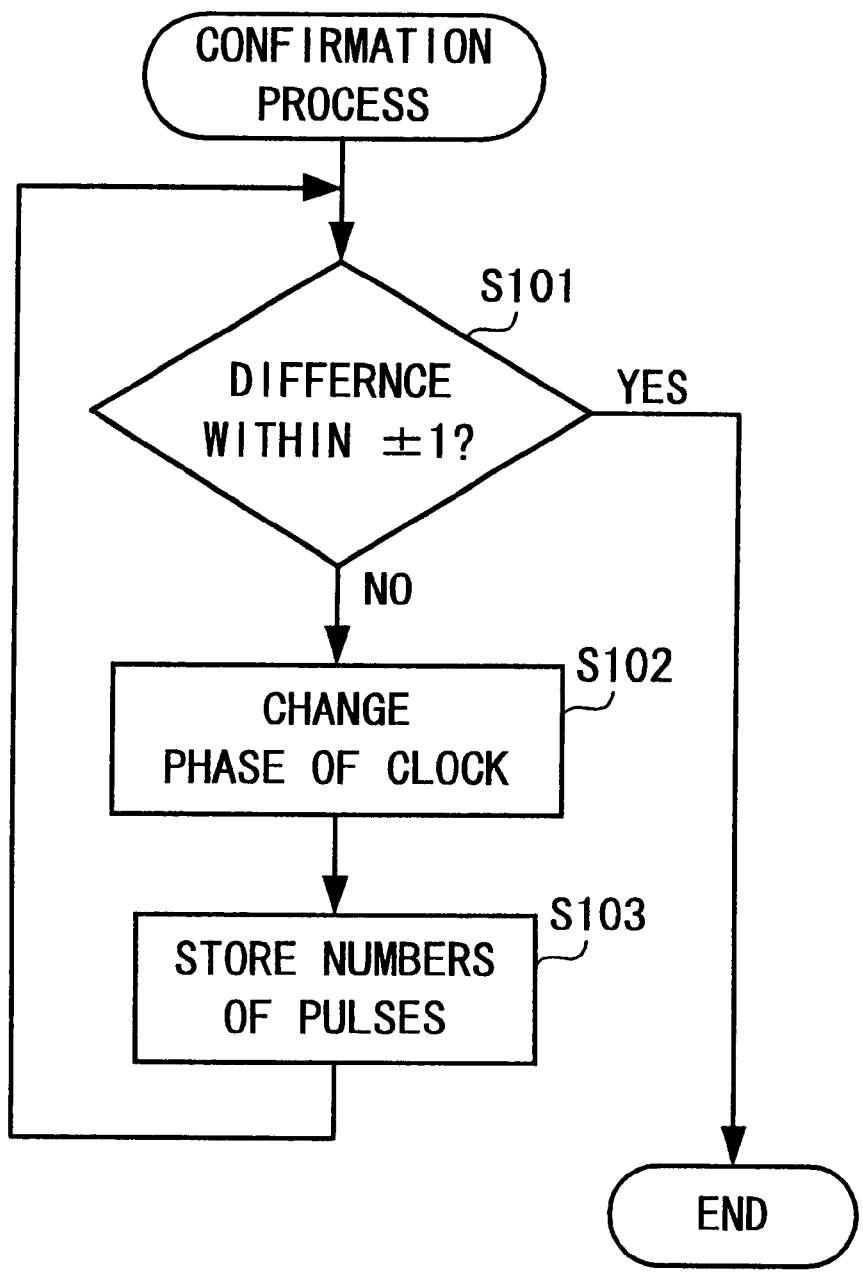
FIG. 6 is a flowchart showing confirmation processes conducted by an MPU (Micro Processing Unit) which constitutes the interface circuit of FIG. 1.

Therefore, before adjusting the frequency, the MPU 5A performs the confirmation process, shown in FIG. 6, confirming whether or not the numbers $HD_{min1}$, $HD_{min2}$, $HD_{max1}$, and $HD_{max2}$ have been counted correctly.

First, the MPU 5A detects whether the difference between the numbers $HD_{min1}$ and $HD_{min2}$ is within a range of ±1, which contains the measuring error (step S101).

In the case where it is detected that the difference is within the range of ±1 (step S101; YES), the MPU 5A determines that both of the numbers have been counted correctly, and completes the confirmation process.

Figure 5B:
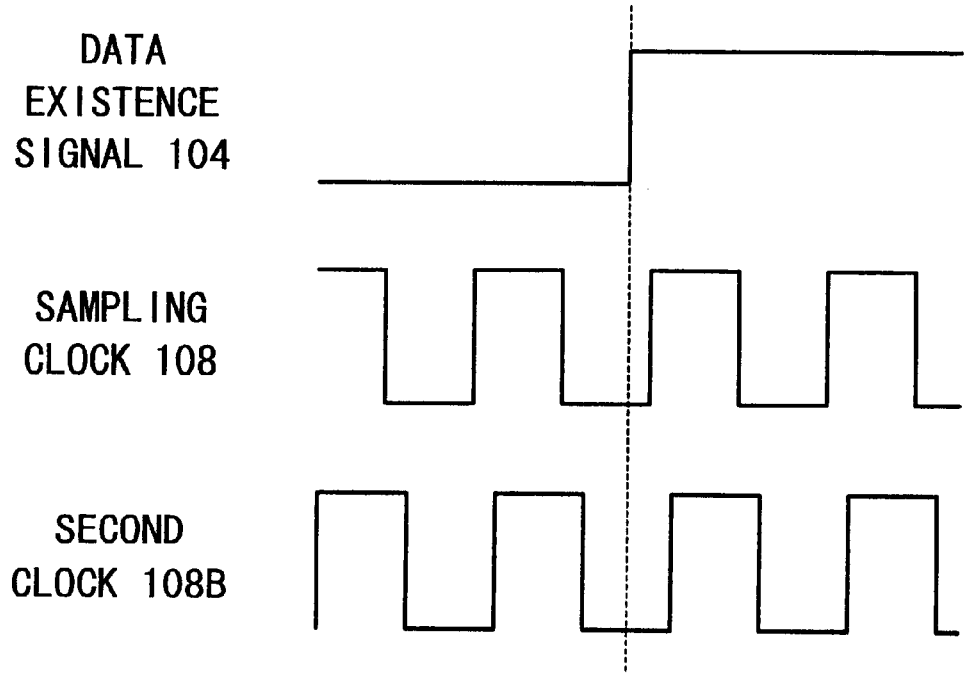
FIG. 5B is a diagram showing a condition where a rise of the data existence signal is changed from a rise of the sampling clock.

On the other hand, in the case where it is detected that the difference is not within ±1(step S101; NO), the MPU 5A determines that at least one of the numbers has not been counted correctly. The MPU 5A adjusts the delay amount of the first delay circuit 6 or the second delay circuit 7, and, as shown in FIG. 5B, changes the phase of the first clock 108 or the second clock 108B (step S102).

After this, the MPU 5A obtains the numbers of pulses $HD_{min1}$, $HD_{min2}$, $HD_{max1}$, and $HD_{max2}$ again from the measurement result signals 111 supplied from the measuring circuit 8A. The MPU 5A stores the minimum number among the numbers $HD_{min1}$ and the minimum number among the numbers $HD_{min2}$, and the maximum number among the numbers $HD_{max1}$ and the maximum number among the numbers $HD_{max2}$ in the memory (step S103), and the flow returns to the step S101.

The MPU 5A completes the confirmation process when determined that the difference between the numbers $HD_{min1}$ and $HD_{min2}$ is within the range of ±1 in the procedure of step S101.

Figure 7:
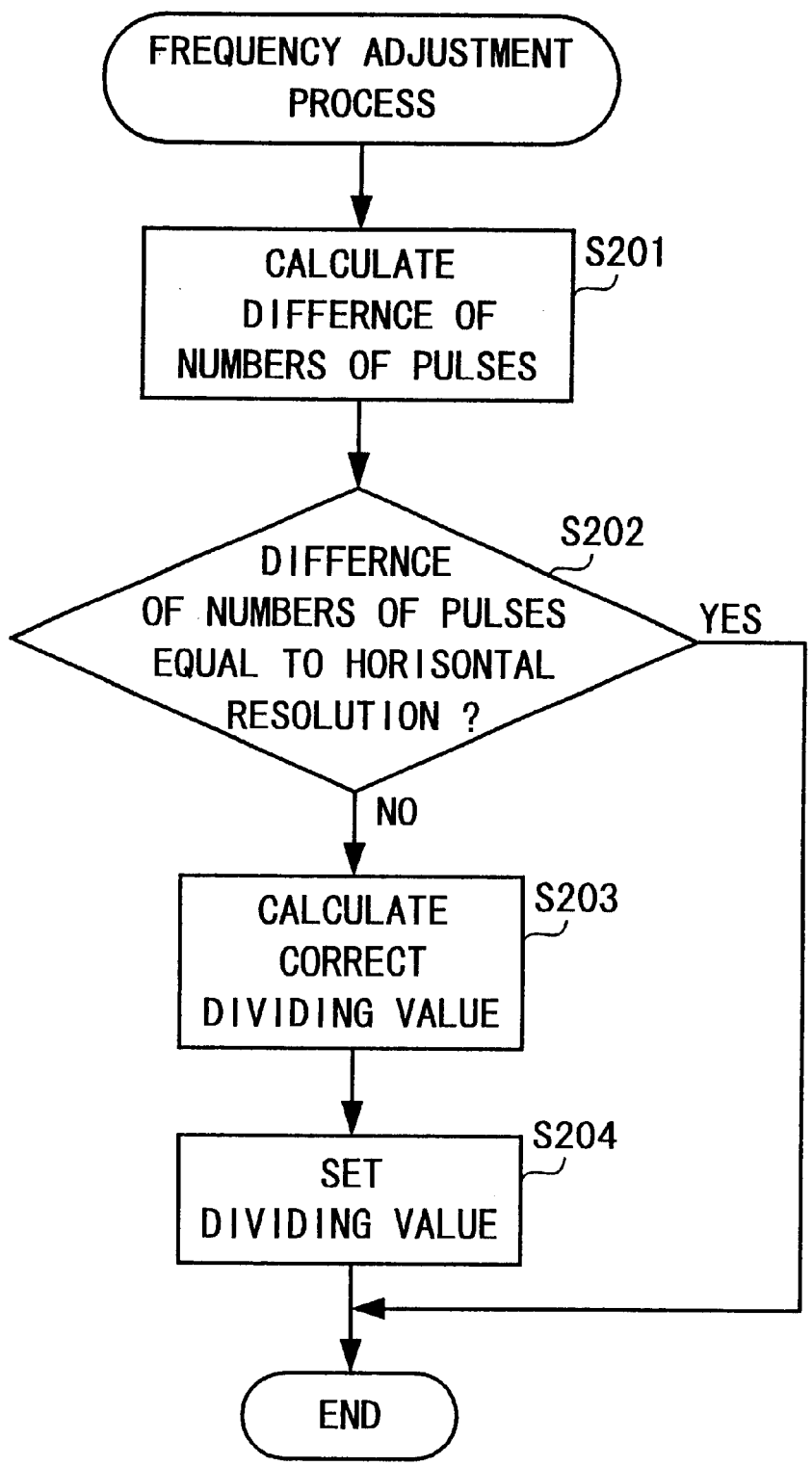
FIG. 7 is a flowchart showing frequency adjustment processes conducted by the MPU.

After confirmed that the numbers $HD_{min}$, $HD_{min2}$, $HD_{max1}$, and $HD_{max2}$ have been counted correctly in the way described above, the MPU 5A performs the frequency adjustment process, shown m FIG. 7, for adjusting the frequency of the sampling clock 108.

First, the MPU 5A obtains the difference between the numbers $HD_{min1}$ and $HD_{max1}$ (pulse difference) ($HD_{max1}-HD_{min1}$) (step S201).

Then, the MPU 5A determines whether or not the pulse difference is equal to the horizontal resolution of the analog image signal 101 which is obtained when setting the dividing value N of the frequency divider 24 (step S202).

As described above, the difference between the minimum number $HD_{min1}$ and the maximum number $HD_{max1}$ corresponds to the number of the pixels arranged on each horizontal line of an image shown by the analog image signal 101, that is, the horizontal resolution of the analog image signal 101. Due to this, the MPU 5A can determine whether or not the frequency of the sampling clock 108 is an adequate value by determining whether or not the pulse difference is equal to the horizontal resolution.

When determined that the pulse difference is equal to the horizontal resolution (step S202; YES), the MPU 5A determines that the frequency of the sampling clock 108 is an adequate value, and completes the frequency adjustment process.

On the other hand, when determined that the pulse difference is not equal to the horizontal resolution value (step S202; NO), the MPU 5A obtains the correct dividing value N of the frequency divider 24 which is included in the PLL circuit 4A (step S203). Specifically, the MPU 5A obtains the correct dividing value N, using the equation (1) described below.

(the correct dividing value)={(the horizontal resolution value of the analog image signal 101)/($HD_{max1}-HD_{min1}$)}×(the current dividing value)　　(1)

The MPU 5A sets the correct dividing value obtained using the equation (1) into the frequency divider 24 (step S204). Then, the frequency of the base clock 107, namely, the sampling clock 108 is set equal to the frequency of the video clock of the device which generates the image signal 101.

Now, the MPU 5A has completed the frequency adjustment process.

As described above, since the correct dividing value N is obtained using the equation (1), the frequency can be adjusted to the correct frequency efficiently in a short time, even if the pulse difference is greatly different from the horizontal resolution.

Figure 8:
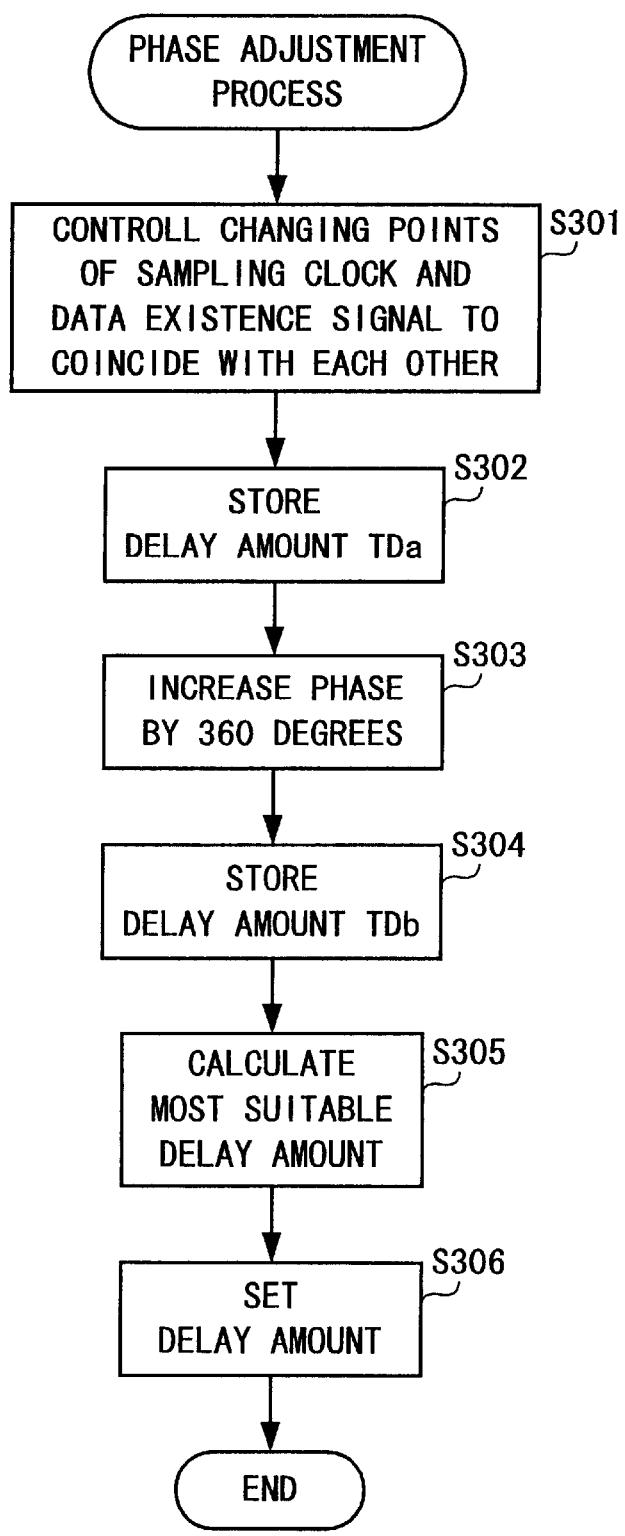
FIG. 8 is a flowchart showing phase adjustment processes conducted by the MPU.

Next, the MPU 5A performs a phase adjustment process, shown in FIG. 8, for adjusting the phase of the sampling clock 108, whose frequency has already been adjusted. In this phase adjustment process, the above number $HD_{min1}$ is used.

Figure 14:
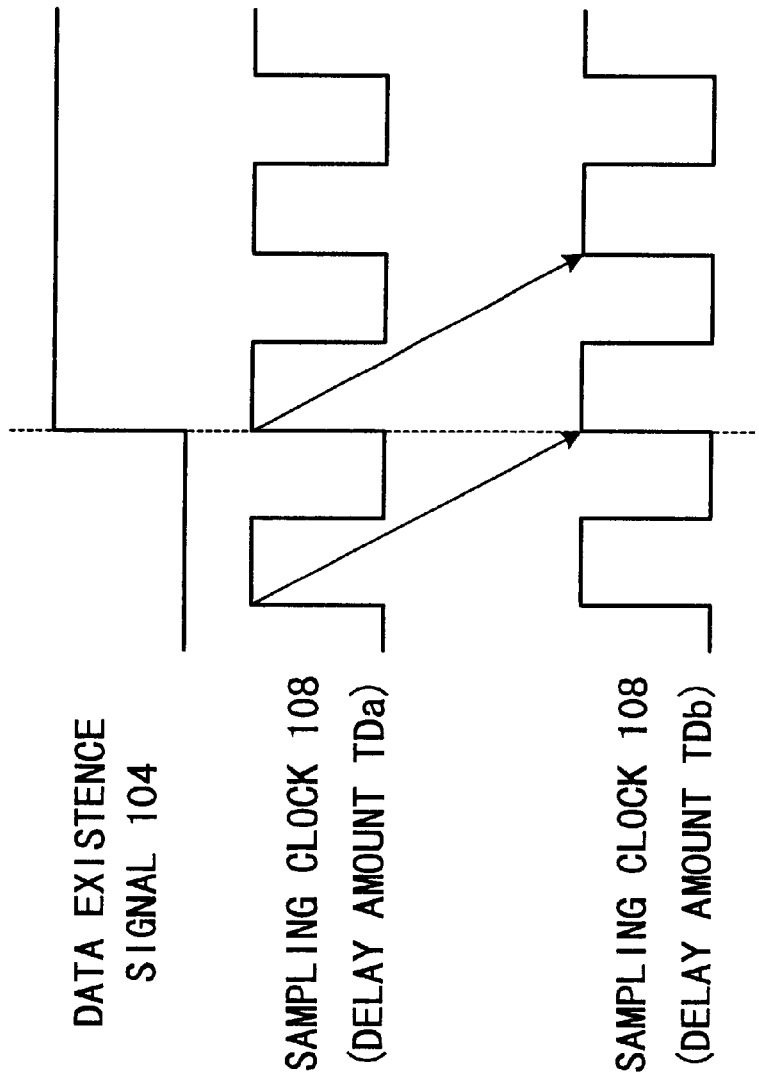
FIG. 14 is a diagram showing conditions before and after the phase of the sampling clock is changed one pulse ahead of the data existence signal.

The MPU 5A controls the changing point of the sampling clock 108 and the changing point of the data existence signal 104 to coincide with each other, as shown in FIG. 14, by changing the delay amount of the first delay circuit 6 (step S301). This condition is referred to as the "first condition". It can be easily determined whether or not those changing points coincide with each other by determining whether or not the number $HD_{min1}$ of pulses of the sampling clock 108 is equal to the number $HD_{min2}$ of pulses of the second clock 108B.

Then, the MPU 5A stores, as a delay amount TDa, the delay amount of the first delay circuit 6 which is obtained in the first condition, in the memory (step S302).

The MPU 5A increases the phase of the sampling clock 108 by 360 degrees, by changing the delay amount of the first delay circuit 6 (step S303). Due to this, the MPU 5A controls the next changing point of the sampling clock 108 and the changing point of the data existence signal 104 to coincide with each other as shown in FIG. 14. This condition is referred to as the "second condition". It can be easily determined whether or not the phase of the sampling clock 108 is changed by 360 degrees, that is, the sampling of clock 108 is shifted by one pulse, by determining whether or not the number $HD_{min1}$ of pulses of the sampling clock 108 is equal to the number $HD_{min2}$ of pulses of the second clock 108B.

Then, the MPU 5A stores, as the delay amount TDb, the delay amount of the first delay circuit 6 which is obtained in the second condition, in the memory (step S304).

It is preferred to set the phase of the sampling clock 108 to a phase having been delayed by an amount which is an intermediate amount between the amounts obtained in the respective first and second conditions, in order to sample the image signal 102 while the level of the image signal 102 is stable. In consideration of this fact, the MPU 5A calculates the most suitable delay amount of the first delay circuit 6, using the equation (2) described below (step S305).

(most suitable delay amount)=$(TDa+TDb)/2$　　(2)

Then, the MPU 5A sets the calculated delay amount into the first delay circuit 6 (step S306). The sampling clock 108 is adjusted to have the phase most suitable for sampling the image signal 102.

Now, the MPU 5A has completed the phase adjustment process.

As described above, the measuring circuit 8A counts the numbers of pulses of the sampling clock 108 and second clock 108B. The frequency of the sampling clock 108 is equal to that of the second clock 108B, whereas the phase of the sampling clock 108 differs from that of the second clock 108B. The MW 5A can easily determine whether or not the numbers have been counted correctly by comparing the numbers of the above two clocks 108 and 108B. When adjusting the phase of the sampling clock 108, the MPU 5A can easily determine whether or not the sampling clock 108 has been shifted by one pulse, by comparing the numbers of pulses of the two clocks 108 and 108B. Having performed this, the frequency and the phase of the sampling clock 108 can be adjusted correctly. As a result, a digital image can be displayed with good looks.

As described above, in the structure where the delay circuit 25 is provided in the PLL circuit 4A, the numbers $HD_{min1}$, $HD_{min2}$, $HD_{max1}$, and $HD_{max2}$ can reliably be counted.

When the frequency and the phase of the sampling clock 108 are adjusted, the phase of the first clock 108 or second clock 108B is changed. In this case, the changing point of the first clock 108 or second clock 108 may coincide with the changing point of the regenerative horizontal synchronizing signal 106A. In such a condition, the numbers $HD_{min1}$, $HD_{min2}$, $HD_{max1}$, and $HD_{max2}$ can not be counted correctly.

However, the MPU 5A changes the delay amount of the delay circuit 25 changes the phase of the regenerative horizontal synchronizing signal 106A, thereby avoiding the coincidence of the changing points. Due to this, the numbers $HD_{min1}$, $HD_{min2}$, $HD_{max1}$, and $HD_{max2}$ can further reliably be counted.

Figure 9:
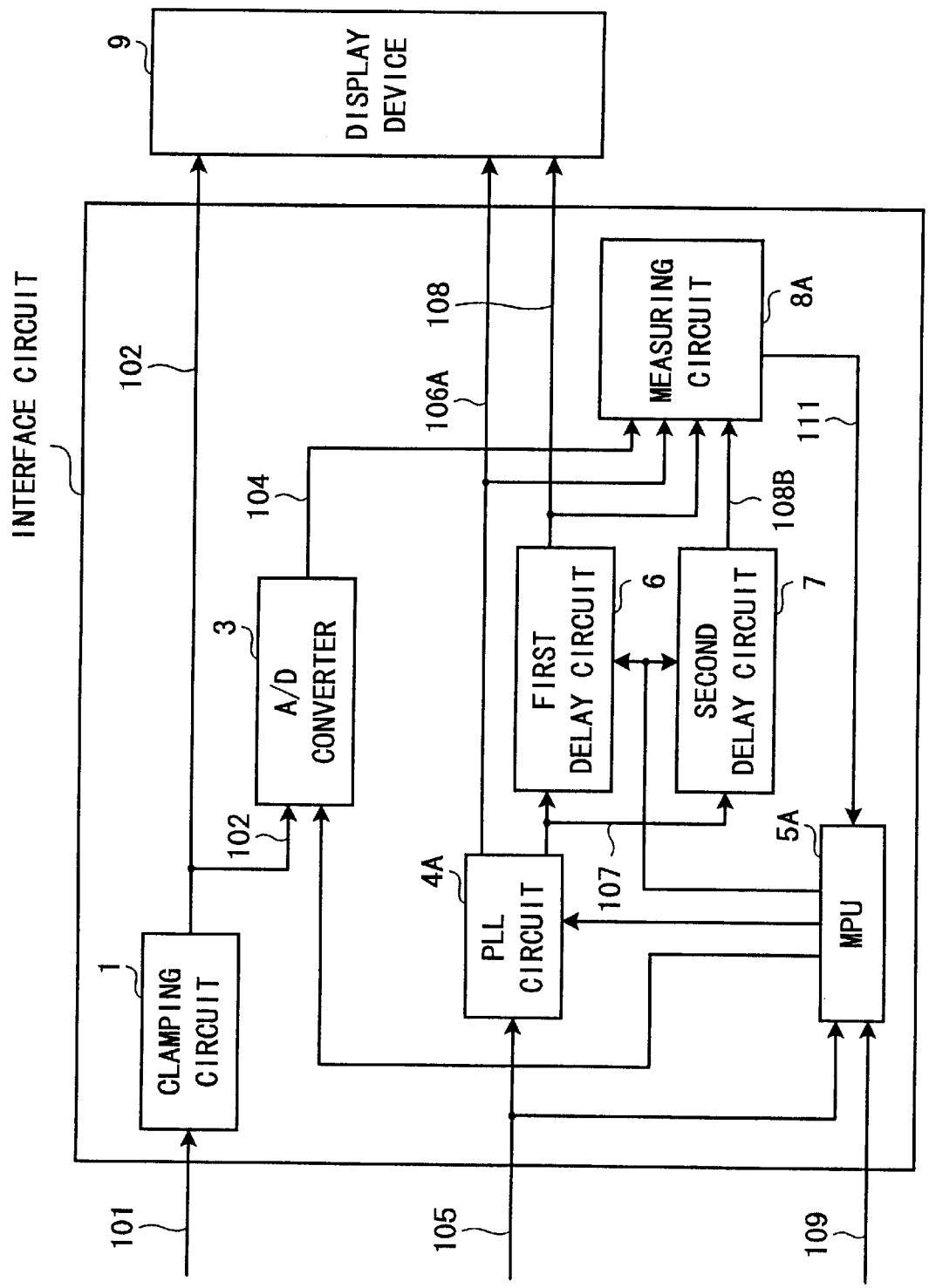
FIG. 9 is another block diagram of the interface circuit according to the embodiment of the present invention.
Figure 10:
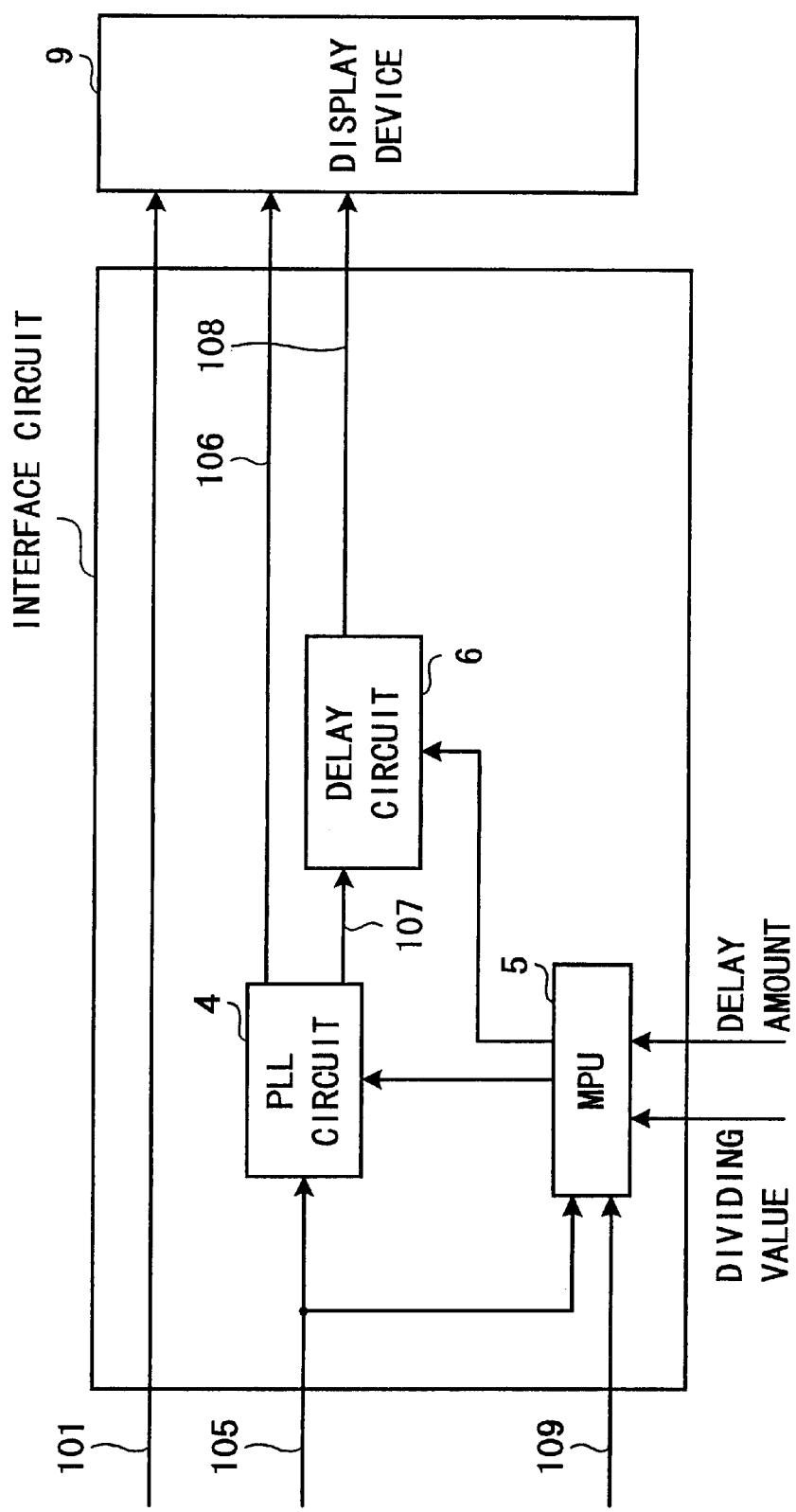
FIG. 10 is a block diagram showing a conventional interface circuit.
Figure 11:
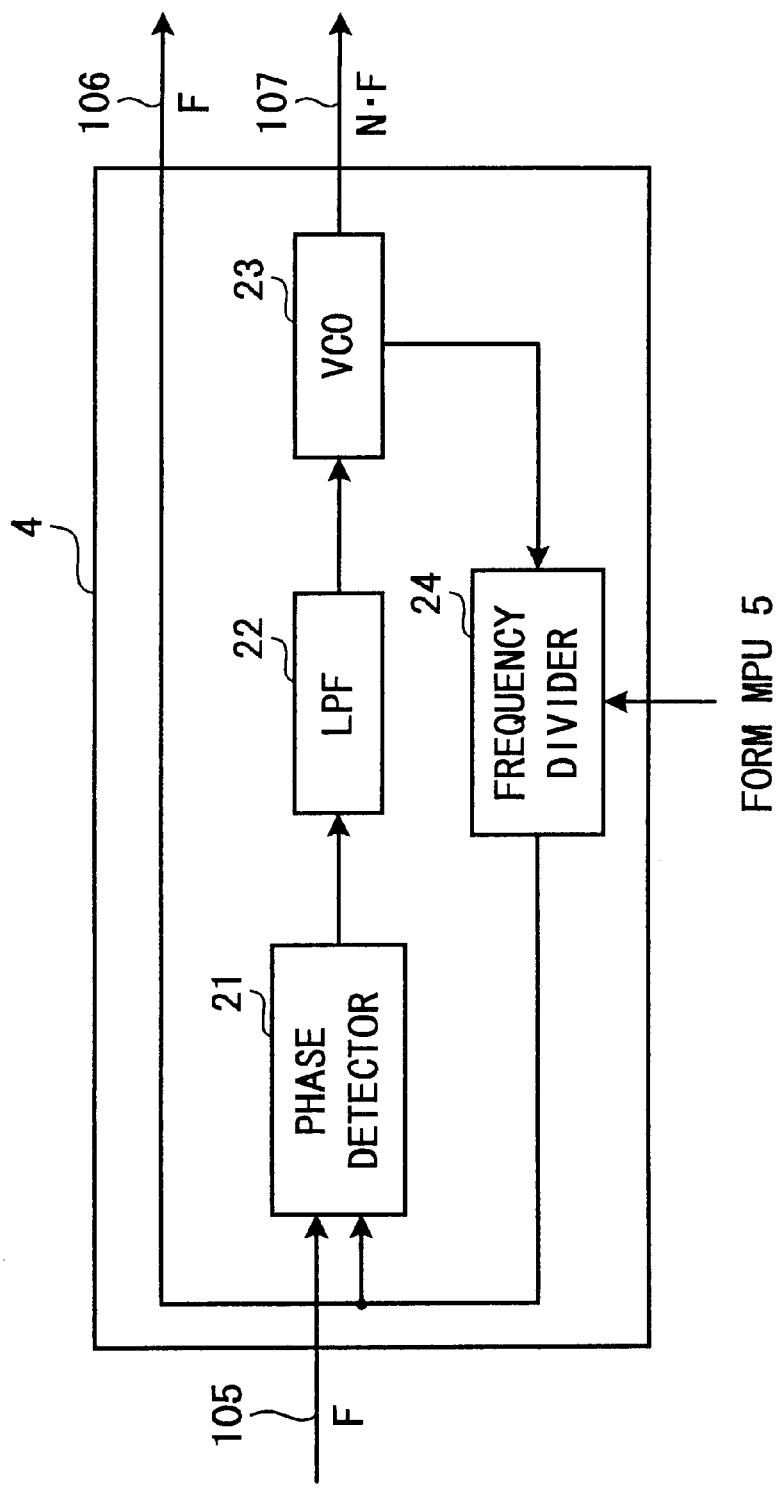
FIG. 11 is a block diagram showing a PLL circuit which constitutes the interface circuit of FIG. 10.
Figure 12:
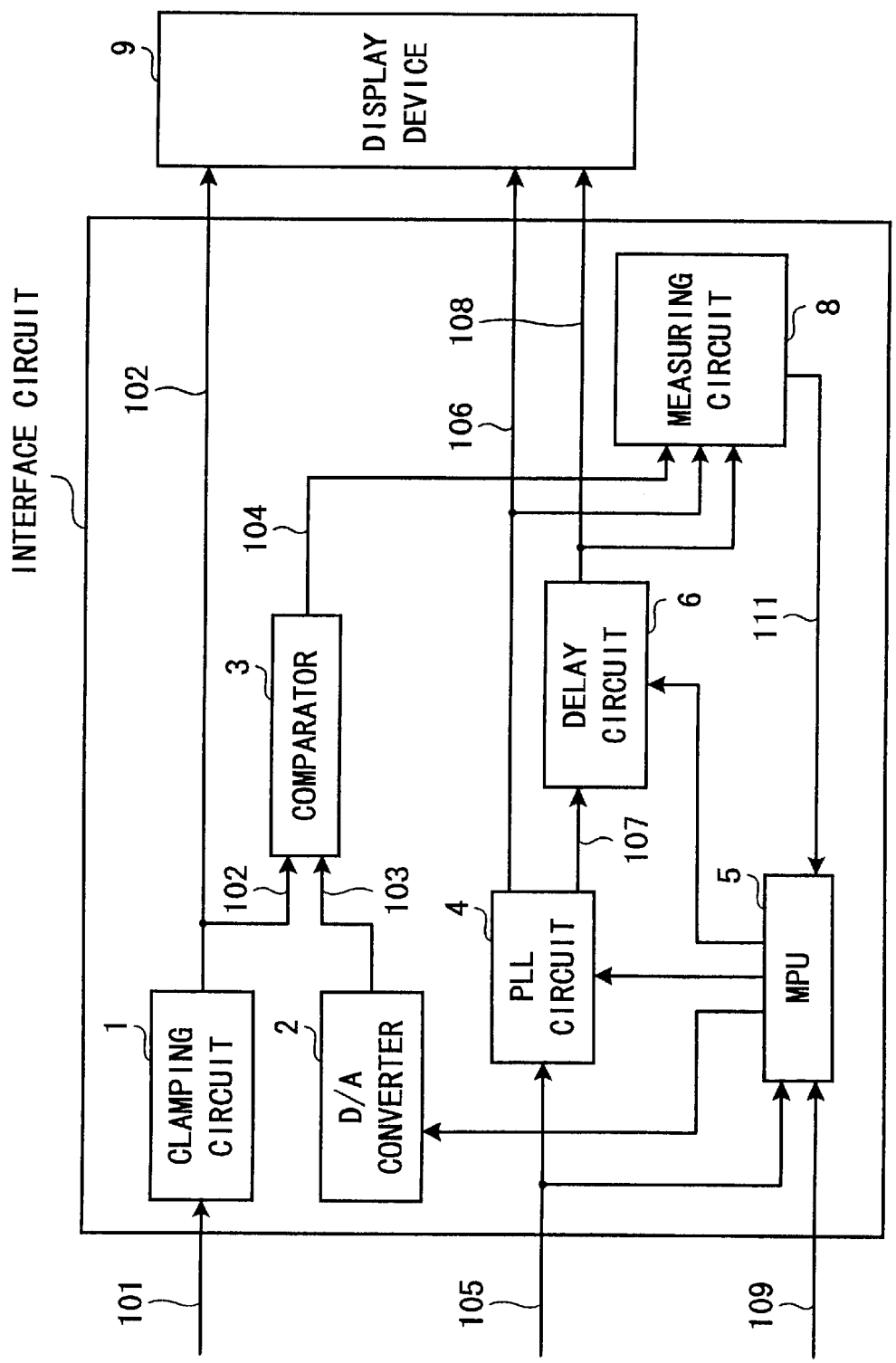
FIG. 12 is a block digram showing another conventional interface circuit.
Figure 13:
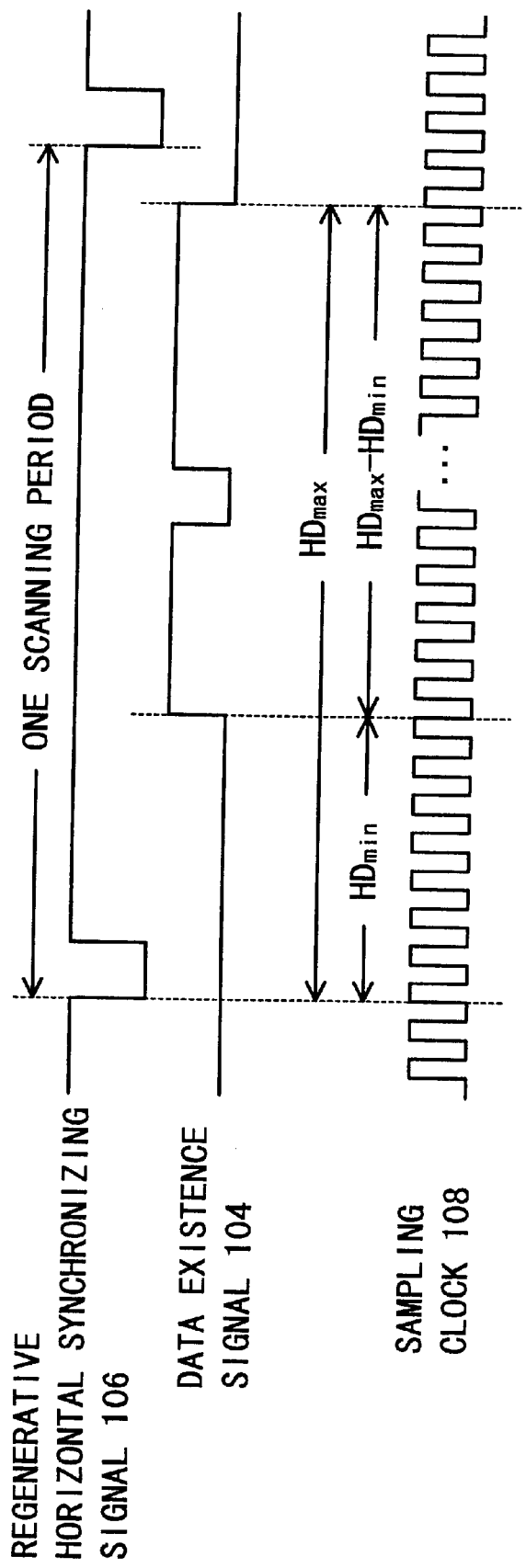
FIG. 13 is a diagram showing pulses counted by a measuring circuit which constitutes the interface circuit of FIG. 12.

As shown in FIG. 9, the aforementioned interface circuit may comprise an A/D converter 3A instead of the comparator 3. This A/D converter 3A output a signal of eight bits. In this case, of eight bits of the output signal, a bit of a predetermined ordinal number may be selected. The selected bit may be supplied as the data existence signal 104 to the measuring circuit 8A. Further, the MPU 5A may select which bit to be used as the data existence signal 104.

Since an ordinary digital display device 9 comprises an A/D converter, it is possible to simplify the structure of the interface circuit by sharing the A/D converter 3A together with the display device 9.

Various embodiments and changes may be made thereonto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2000-074794 filed on Mar. 16, 2000, and including specification, claims, drawings and summary. The disclosure of the above Japanese Patent Application is incorporated herein by reference in its entirety.

What is claimed is:

1. A sampling clock adjusting method, comprising:
    counting a number of pulses of a sampling clock for sampling an analog image signal and a number of pulses of an adjustment clock having a frequency equal to a frequency of the sampling clock and a phase different from a phase of the sampling clock, for a predetermined time period;

determining whether or not the number of pulses of the sampling clock has been counted correctly, by comparing the counted number of pulses of the sampling clock and the counted number of pulses of the adjustment clock; and adjusting the frequency and phase of the sampling clock in a case where it is determined that the number of pulses of the sampling clock has been counted correctly.

2. The sampling clock adjusting method according to claim 1, wherein said determining whether or not the number of pulses of the sampling clock has been counted correctly includes determining whether or not the number of pulses of the sampling clock has been counted correctly by determining whether or not the number of pulses of the sampling clock coincides with the number of pulses of the adjustment clock within a range of an error.

3. The sampling clock adjusting method according to claim 2, further comprising controlling the number of pulses of the sampling clock to coincide with the number of pulses of the adjustment clock within the range of the error by changing the phase of the sampling clock or the phase of the adjustment clock, in a case where it is determined that the number of pulses of the sampling clock has not been counted correctly.

4. The sampling clock adjusting method according to claim 3, wherein:

said counting includes counting the numbers of pulses of the sampling clock and adjustment clock, respectively, during a time period since a change in a level of a horizontal synchronizing signal supplied together with the analog image signal until a change in a level of a data existence signal indicating whether or not the analog image signal includes predetermined data; and said determining whether or not the number of pulses of the sampling clock has been counted correctly includes determining whether or not the number of pulses of the sampling clock has been counted correctly by determining whether or not a difference between the number of pulses of the sampling clock and the number of pulses of the adjustment clock is equal to or lower than 1 pulse.

5. The sampling clock adjusting method according to claim 4, further comprising:

generating a base clock by changing a frequency of the horizontal synchronizing signal; and generating the sampling clock and the adjustment clock by delaying a phase of the base clock by different delay amounts, respectively.

6. The sampling clock adjusting method according to claim 5, wherein said adjusting the frequency of the sampling clock comprises:

deriving a horizontal resolution of the analog image signal from a vertical synchronizing signal, supplied together with the analog image signal, and the horizontal synchronizing signal;

counting a number $HD_{min}$ of pulses of the sampling clock during a time period since a change in the horizontal synchronizing signal until a first change in the data existence signal, and a number $HD_{max}$ of pulses of the sampling clock during a time period since the change in the horizontal synchronizing signal until a final change in the data existence signal within a range of one scanning period;

determining whether or not a difference in the numbers $HD_{max}$ and $HD_{min}$ ($HD_{max}-HD_{min}$) corresponds to the horizontal resolution; and adjusting the frequency of the sampling clock in a case where it is determined that the difference in the numbers of pulses $HD_{max}$ and $HD_{min}$ does not coincide with the horizontal resolution.

7. The sampling clock adjusting method according to claim 6, wherein:

said generating the base clock includes changing the frequency of the horizontal synchronizing signal with using a phase lock loop circuit which includes a frequency divider; and said adjusting the frequency of the sampling clock includes adjusting the frequency of the sampling clock by changing a dividing value of the frequency divider.

8. The sampling clock adjusting method according to claim 7, wherein said adjusting the frequency of the sampling clock includes deriving the changed dividing value from an equation (1)

(the changed dividing value)=(the horizontal resolution)/(the difference between the numbers $HD_{max}$ and $HD_{min}$)×(the current dividing value)   (1).

9. An interface circuit, comprising:

a first counter which counts a number of pulses of a sampling clock for sampling an analog image signal and a number of pulses of an adjustment clock having a frequency equal to a frequency of the sampling clock and a phase different from a phase of the sampling clock, for a predetermined time period;

a first determination unit which determines whether or not the number of pulses of the sampling clock has been counted correctly, by comparing the counted number of pulses of the sampling clock and the counted number of pulses of the adjustment clock; and a sampling clock adjustment unit which adjusts the frequency and phase of the sampling clock in a case where said first determination unit determines that the number of pulses of the sampling clock has been counted correctly.

10. The interface circuit according to claim 9, wherein said first determination unit determines whether or not the number of pulses of the sampling clock has been counted correctly by determining whether or not the number of pulses of the sampling clock coincides with the number of pulses of the adjustment clock within a range of an error.

11. The interface circuit according to claim 10, further comprising a phase changing unit which controls the number of pulses of the sampling clock to coincide with the number of pulses of the adjustment clock within the range of the error by changing the phase of the sampling clock or the phase of the adjustment clock, when said first determination unit determines that the number of pulses of the sampling clock has not been counted correctly.

12. The interface circuit according to claim 11, wherein:

said first counter counts the number of pulses of the sampling clock and the number of pulses of the adjustment clock respectively, during a time period since a change in a level of a horizontal synchronizing signal supplied together with the analog image signal until a change in a level of a data existence signal indicating whether or not the analog image signal includes predetermined data; and said first determination unit determines whether or not the number of pulses of the sampling clock has been counted correctly by determining whether or not a difference between the number of pulses of the sampling clock and the number of pulses of the adjustment clock is equal to or lower than 1 pulse.

13. The interface circuit according to claim 12, further comprising:

a base clock generating unit which generates a base clock by changing a frequency of the horizontal synchronizing signal; and a phase delaying unit which generates the sampling clock and the adjustment clock by delaying a phase of the base clock by different delay amounts, respectively.

14. The interface circuit according to claim 13, wherein said sampling clock adjustment unit comprises:

a resolution specifying unit which derives a horizontal resolution of the analog image signal from a vertical synchronizing signal, supplied together with the analog image signal, and the horizontal synchronizing signal;

a second counter which counts a number $HD_{min}$ of pulses of the sampling clock during a time period since a change in the horizontal synchronizing signal until a first change in the data existence signal, and a number $HD_{max}$ of pulses of the sampling clock during a time period since the change of the horizontal synchronizing signal until a final change in the data existence signal within a range of one scanning period;

a second determination unit which determines whether or not a difference in the numbers $HD_{max}$ and $HD_{min}$ ($HD_{max}-HD_{min}$) corresponds to the horizontal resolution; and a frequency adjustment unit which adjusts the frequency of the sampling clock when said second determination unit determines that the difference in the numbers of pulses $HD_{max}$ and $HD_{min}$ does not coincide with the horizontal resolution.

15. The interface circuit according to claim 14, wherein:

said base clock generating unit includes a phase lock loop circuit which has a frequency divider; and said frequency adjustment unit adjusts the frequency of the sampling clock by changing a dividing value of the frequency divider.

16. The interface circuit according to claim 15, wherein said frequency adjustment unit derives the changed dividing value from an equation (2)

$$\text{(the changed dividing value)} = \text{(the horizontal resolution)}/\text{(the difference between the numbers } HD_{max} \text{ and } HD_{min}) \times \text{(the current dividing value)} \quad (2).$$

* * * * *